(12) United States Patent
Matsuda (10) Patent No.: US 8,993,430 B2
(45) Date of Patent: Mar. 31, 2015

(54) MANUFACTURING METHOD OF SEMICONDUCTOR DEVICE AND SEMICONDUCTOR DEVICE

(75) Inventor: Yuya Matsuda, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 13/411,925

(22) Filed: Mar. 5, 2012

(65) Prior Publication Data

US 2013/0082388 A1   Apr. 4, 2013

(30) Foreign Application Priority Data

Sep. 30, 2011   (JP) .................................. 2011-217825

(51) Int. Cl.
| | | |
|---|---|---|
| *H01L 21/28* | (2006.01) | |
| *H01L 23/48* | (2006.01) | |
| *H01L 23/58* | (2006.01) | |
| *H01L 27/115* | (2006.01) | |

(52) U.S. Cl.
CPC ........ *H01L 23/585* (2013.01); *H01L 27/11519* (2013.01); *H01L 27/11529* (2013.01); *H01L 2924/0002* (2013.01)
USPC ........... 438/612; 438/128; 438/129; 438/597; 257/E21.158; 257/23.01

(58) Field of Classification Search
None
See application file for complete search history.

(56) References Cited

U.S. PATENT DOCUMENTS

| | | | |
|---|---|---|---|
| 2010/0096719 A1* | 4/2010 | Lee et al. ....................... | 257/506 |
| 2011/0103147 A1* | 5/2011 | Park et al. ................. | 365/185.17 |
| 2012/0020158 A1 | 1/2012 | Ozaki et al. | |
| 2012/0156876 A1* | 6/2012 | Chen et al. .................... | 438/689 |

FOREIGN PATENT DOCUMENTS

| | | |
|---|---|---|
| JP | 2000-150828 | 5/2000 |
| JP | 2005-303089 | 10/2005 |
| JP | 2010-153869 | 7/2010 |
| JP | 2011-3596 | 1/2011 |
| JP | 2011-54758 | 3/2011 |

* cited by examiner

*Primary Examiner* — Angel Roman
(74) *Attorney, Agent, or Firm* — Oblon, McClelland, Maier & Neustadt, L.L.P.

(57) ABSTRACT

According to one embodiment, a first core pattern is formed in a wiring portion on a process target film and a second core pattern, which is led out from the first core pattern and includes an opening, is formed in a leading portion on the process target film, a sidewall pattern is formed along an outer periphery of the first core pattern and the second core pattern and a sidewall dummy pattern is formed along an inner periphery of the opening of the second core pattern, the first core pattern and the second core pattern are removed, and the process target film is processed to transfer the sidewall pattern and the sidewall dummy pattern.

7 Claims, 7 Drawing Sheets

MANUFACTURING METHOD OF SEMICONDUCTOR DEVICE AND SEMICONDUCTOR DEVICE

CROSS-REFERENCE TO RELATED APPLICATIONS

This application is based upon and claims the benefit of priority from Japanese Patent Application No. 2011-217825, filed on Sep. 30, 2011; the entire contents of which are incorporated herein by reference.

FIELD

Embodiments described herein relate generally to a manufacturing method of a semiconductor device and a semiconductor device.

BACKGROUND

In semiconductor devices, the space of a leading portion becomes wide compared with a wiring portion. Therefore, a micro-loading effect becomes high in the leading portion compared with the wiring portion, so that the line width in the leading portion becomes thinner than the line width in the wring portion in some cases.

DETAILED DESCRIPTION

In general, according to a manufacturing method of a semiconductor device in embodiments, forming a first core pattern in a wiring portion on a process target film and forming a second core pattern, which is led out from the first core pattern and includes an opening, in a leading portion on the process target film, forming a sidewall pattern along an outer periphery of the first core pattern and the second core pattern and forming a sidewall dummy pattern along an inner periphery of the opening of the second core pattern, removing the first core pattern and the second core pattern, and processing the process target film to transfer the sidewall pattern and the sidewall dummy pattern are included.

A semiconductor device according to the embodiments will be explained below with reference to the drawings. The present invention is not limited to these embodiments.

First Embodiment

Figure 1A:
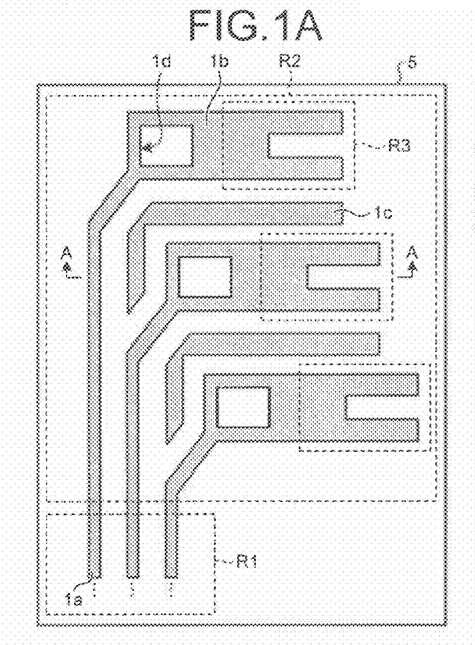
FIG. 1A to FIG. 1C are plan views illustrating a manufacturing method of a semiconductor device according to a first embodiment.
Figure 1B:
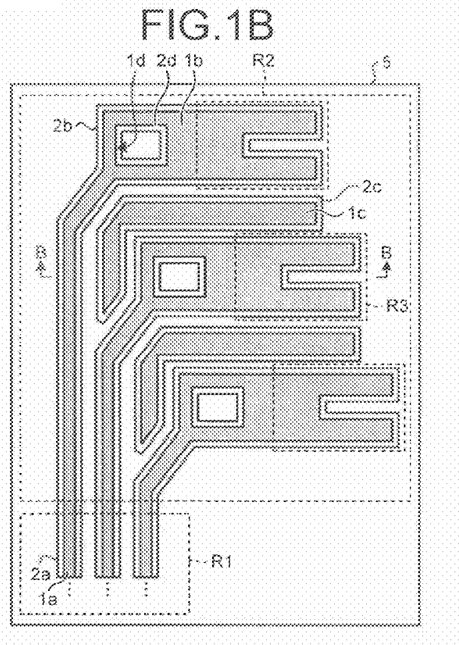
Figure 1C:
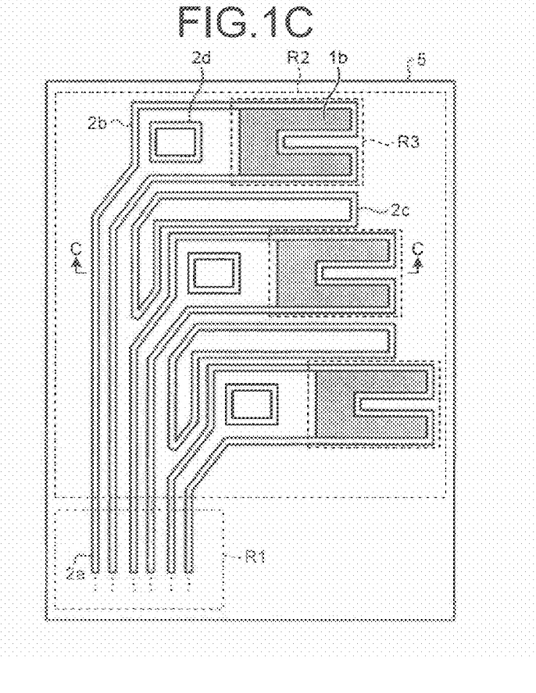
Figure 2A:
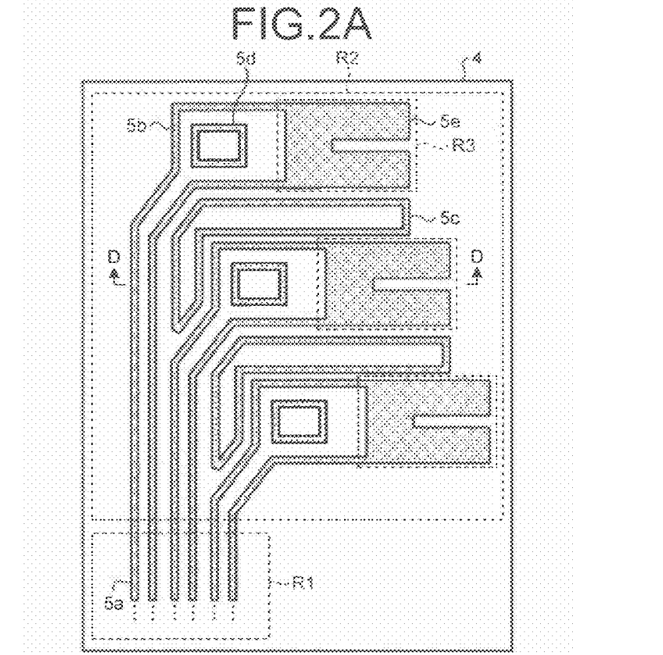
FIG. 2A and FIG. 2B are plan views illustrating the manufacturing method of the semiconductor device according to the first embodiment.
Figure 2B:
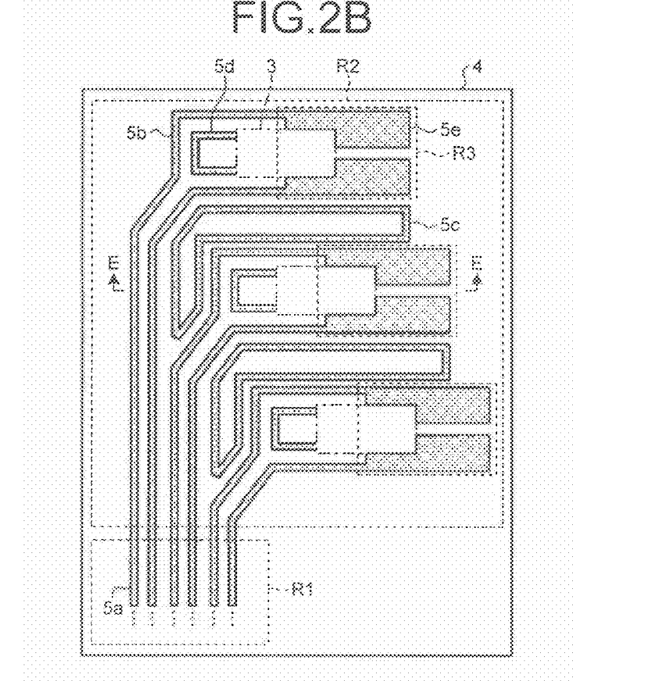
Figure 3A:
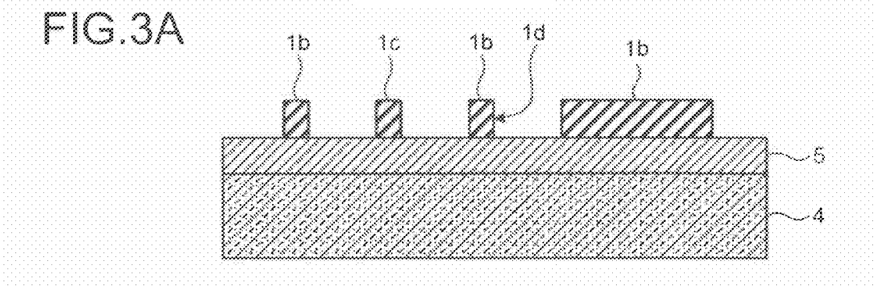
FIG. 3A to FIG. 3E are cross-sectional views illustrating the manufacturing method of the semiconductor device according to the first embodiment.
Figure 3B:
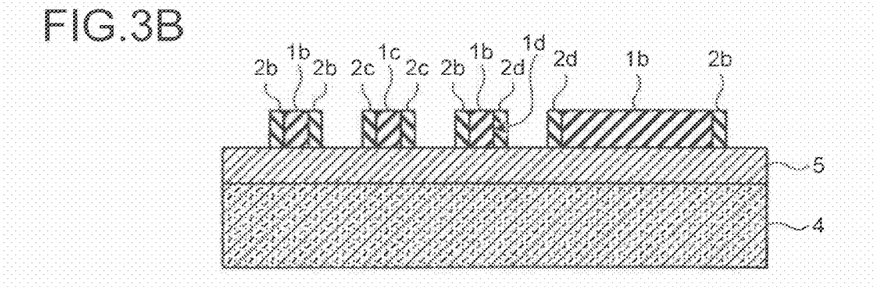
Figure 3C:
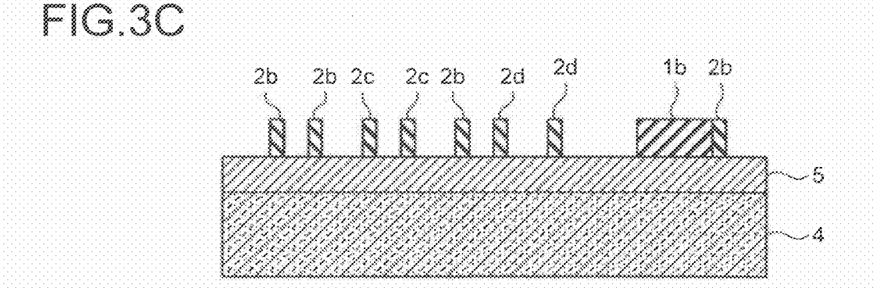
Figure 3D:
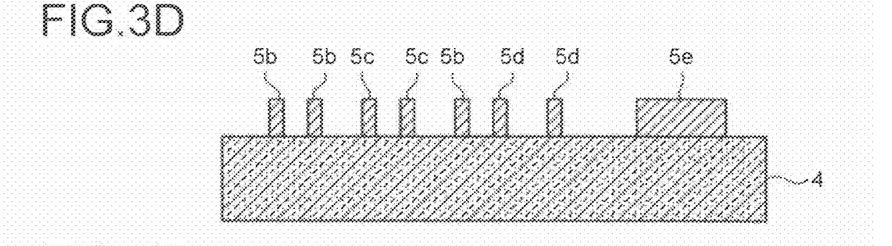
Figure 3E:
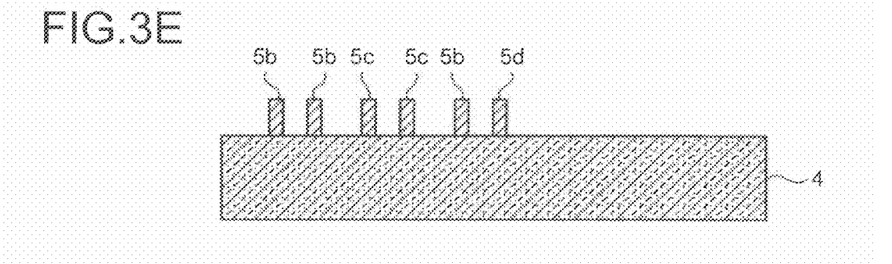

FIG. 1A to FIG. 1C and FIG. 2A and FIG. 2B are plan views illustrating a manufacturing method of a semiconductor device according to the first embodiment, and FIG. 3A to FIG. 3E are cross-sectional views illustrating the manufacturing method of the semiconductor device according to the first embodiment. FIG. 3A is a cross-sectional view cut along line A-A in FIG. 1A, FIG. 3B is a cross-sectional view cut along line B-B in FIG. 1B, FIG. 3C is a cross-sectional view cut along line C-C in FIG. 1C, FIG. 3D is a cross-sectional view cut along line D-D in FIG. 2A, and FIG. 3E is a cross-sectional view cut along line E-E in FIG. 2B.

In FIG. 1A and FIG. 3A, a process target film 5 is formed on a base layer 4. In the process target film 5, a wiring portion R1 and a leading portion R2 are provided, and pad portions R3 are provided in the leading portion R2. The base layer 4 may be a semiconductor substrate or may be a dielectric layer or the like formed on a semiconductor substrate, and is not particularly limited. Moreover, as the material of the process target film 5, for example, a polycrystalline silicon film used for a word line and the like can be used. Moreover, in the wiring portion R1, a plurality of wires 5a in FIG. 2A can be formed parallel to each other. These wires 5a can be formed with a line & space pattern having a substantially constant pitch, and for example, the wire width and the wire interval can be set to 1:1. These wires 5a may be, for example, word lines of a NAND memory or the like or may be gate electrodes of a logic circuit or the like.

In the leading portion R2, leading lines 5b led out from the wires 5a of the wiring portion R1 can be formed. The pad portion R3 is provided at the tip end of this leading line 5b, and a pad electrode 5e connected to the leading lines 5b can be provided in the pad portion R3.

Then, core patterns 1a are formed in the wiring portion R1 and core patterns 1b and core dummy patterns 1c are formed in the leading portion R2. The core pattern 1a is connected to the core pattern 1b and an opening 1d is provided in the core pattern 1b. The core dummy pattern 1c is provided between the core patterns 1b. As the material of the core patterns 1a and 1b and the core dummy patterns 1c, a resist material may be used or a hard mask material, such as a BSG film and a silicon nitride film, may be used.

The line width of the core patterns 1a and 1b and the core dummy patterns 1c may be thinned by slimming the core patterns 1a and 1b and the core dummy patterns 1c by a method such as isotropic etching.

Moreover, the core patterns 1a and 1b and the core dummy pattern 1c do not necessarily need to be formed in the same process and the core patterns 1a and 1b and the core dummy patterns 1c may be formed in different processes. Moreover, the same material does not necessarily need to be used for the core patterns 1a and 1b and the core dummy pattern 1c and different materials may be used. For example, a hard mask material may be used for the core patterns 1a and 1b and a resist material may be used for the core dummy pattern 1c. Moreover, the core pattern 1b and the opening 1d do not necessarily need to be formed in the same process and the core pattern 1b and the opening 1d may be formed in different processes. For example, after forming the core pattern 1b, the opening 1d may be formed in the core pattern 1b.

Next, as shown in FIG. 1B and FIG. 3B, a sidewall material having a high selectivity with respect to the core patterns 1a and 1b and the core dummy patterns 1c is deposited on the whole surface of the process target film 5 including the sidewalls of the core patterns 1a and 1b and the core dummy patterns 1c, for example, by a method such as CVD. As the sidewall material having a high selectivity with respect to the core patterns 1a and 1b and the core dummy patterns 1c, for example, when the core patterns 1a and 1b and the core dummy patterns 1c are formed of a BSG film, a silicon nitride film may be used. Then, the process target film 5 is exposed in a state where the sidewall material is left on the sidewalls of the core patterns 1a and 1b and the core dummy patterns 1c by performing anisotropic etching on the sidewall material. At this time, sidewall patterns 2a and 2b are formed along the outer peripheries of the core patterns 1a and 1b, respectively, a sidewall dummy pattern 2c is formed along the outer periphery of the core dummy pattern 1c, and a sidewall dummy pattern 2d is formed along the inner periphery of the opening 1d of the core pattern 1b.

Next, as shown in FIG. 1C and FIG. 3C, the core patterns 1a and 1b and the core dummy patterns 1c are removed from over the process target film 5 in a state where the sidewall patterns 2a and 2b and the sidewall dummy patterns 2c and 2d are left on the process target film 5 by using a photolithography technology and an etching technology. At this time, in the pad portion R3, the core pattern 1b can be left by being covered with a resist pattern.

Next, as shown in FIG. 2A and FIG. 3D, the process target film 5 is processed with the sidewall patterns 2a and 2b, the sidewall dummy patterns 2c and 2d, and the core patterns 1b left in the pad portions R3 as a mask, so that the wires 5a, on which the sidewall patterns 2a are transferred, are formed in the wiring portion R1 on the base layer 4 and the leading lines 5b, on which the sidewall patterns 2b are transferred, are formed in the leading portion R2 on the base layer 4. At this time, in the pad portion R3, the pad electrode 5e connected to the tip ends of the leading lines 5b is formed in the process target film 5.

Moreover, in the leading portion R2 on the base layer 4, dummy leading lines 5c, on which the sidewall dummy patterns 2c are transferred, are formed in parallel with the leading lines 5b and dummy leading lines 5d, on which the sidewall dummy patterns 2d are transferred, are formed in parallel with the leading lines 5b.

The dummy leading lines 5c and 5d can be arranged such that the interval between the leading line 5b and the dummy leading lines 5c and 5d in the leading portion R2 becomes approximately equal to the interval between the wires 5a in the wiring portion R1. For example, when the line & space of the wires 5a in the wiring portion R1 is set to 1:1, the dummy leading lines 5c and 5d can be arranged such that the line & space around the leading lines 5b in the leading portion R2 becomes 1:1.

Consequently, even when the space of the leading portion R2 is wide compared with the wiring portion R1 and the pitch of the leading lines 5b of the leading portion R2 is larger than the wires 5a of the wiring portion R1, the line & space around the leading lines 5b of the leading portion R2 can be made approximately equal to the line & space of the wires 5a of the wiring portion R1. Therefore, the micro-loading effect around the leading lines 5b of the leading portion R2 can be reduced, so that the line width of the leading lines 5b of the leading portion R2 can be made equal to the wires 5a of the wiring portion R1.

Next, as shown in FIG. 2B and FIG. 3E, a loop cut portion 3 is formed in the dummy leading line 5d and the pad electrode 5e to cut the pad electrode 5e for each of the wires 5a of the wiring portion R1 by using a photolithography technology and an etching technology.

In the above embodiment, the method of processing the process target film 5 with the sidewall patterns 2a and 2b and the sidewall dummy patterns 2c and 2d as a mask is explained, however, it is possible to form a hard mask pattern on the process target film 5 by forming the sidewall patterns 2a and 2b and the sidewall dummy patterns 2c and 2d after forming a hard mask layer on the process target film 5 and processing the hard mask layer with the sidewall patterns 2a and 2b and the sidewall dummy patterns 2c and 2d as a mask and processes the process target film 5 with the hard mask pattern as a mask. At this time, the loop cut portion 3 may be formed in the hard mask pattern on the process target film 5 instead of forming the loop cut portion 3 in the processed process target film 5.

Moreover, for forming the pad electrode 5e, the above embodiment explains the method of leaving part of the core pattern 1b in the pad portion R3 by forming a resist pattern covering part of the core pattern 1b after the process in FIG. 1B and FIG. 3B, and etching the core pattern 1b with the resist pattern as a mask, however, a method other than this can be used. For example, the wires 5a, the leading lines 5b, the dummy leading lines 5c and 5d, and the pad electrodes 5e may be formed by forming a resist pattern to cover the pad portions R3 after removing all of the core patterns 1b without covering with a resist pattern in the process in FIG. 1C and FIG. 3C and processing the process target film 5 with the sidewall patterns 2a and 2b, the sidewall dummy patterns 2c and 2d, and this resist pattern as a mask. Moreover, in any case, when forming a resist pattern for forming the pad electrodes 5e, a wider wire of a not-shown peripheral portion may be formed by leaving a resist pattern also in the peripheral portion of the 1:1 line & space and processing the process target film 5 with the resist pattern as a mask.

Second Embodiment

FIG. 4A to FIG. 4C and FIG. 5A and FIG. 5B are plan views illustrating a manufacturing method of a semiconductor device according to the second embodiment.

Figure 4A:
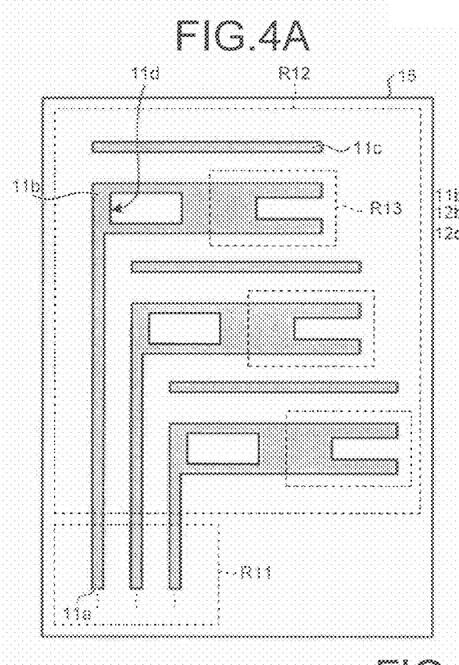
FIG. 4A to FIG. 4C are plan views illustrating a manufacturing method of a semiconductor device according to a second embodiment.
Figure 5A:
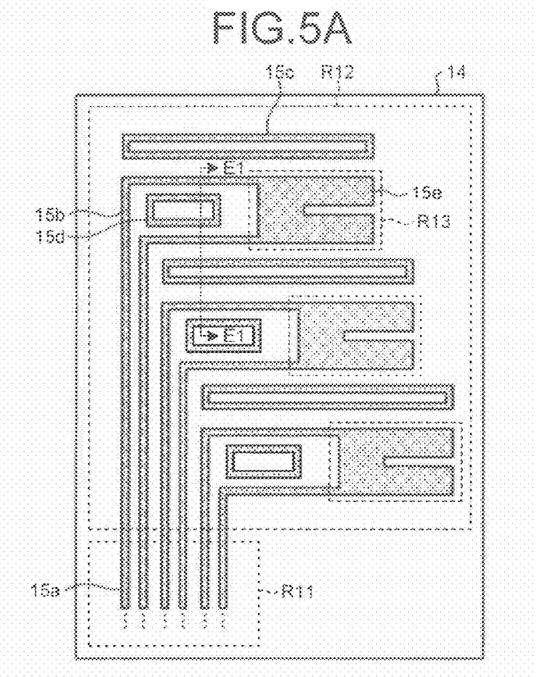
FIG. 5A and FIG. 5B are plan views illustrating the manufacturing method of the semiconductor device according to the second embodiment.

In FIG. 4A, a process target film 15 is formed on a base layer 14 shown in FIG. 5A. In the process target film 15, a wiring portion R11 and a leading portion R12 are provided, and pad portions R13 are provided in the leading portion R12. In the wiring portion R11, a plurality of wires 15a in FIG. 5A can be formed parallel to each other in a pattern similar to the wires 5a in the wiring portion R1 in FIG. 2A.

In the leading portion R12, leading lines 15b led out from the wires 15a of the wiring portion R11 can be formed perpendicular to the wires 15a. The pad portion R13 is provided at the tip end of this leading line 15b, and a pad electrode 15e connected to the leading lines 15b can be provided in the pad portion R13.

Then, core patterns 11a are formed in the wiring portion R11 and core patterns 11b and core dummy patterns 11c are formed in the leading portion R12. The core pattern 11a is connected to the core pattern 11b and an opening 11d is provided in the core pattern 11b. The core dummy pattern 11c is provided between the core patterns 11b. The core pattern 11b is bent at a right angle in the leading portion R12.

Figure 4B:
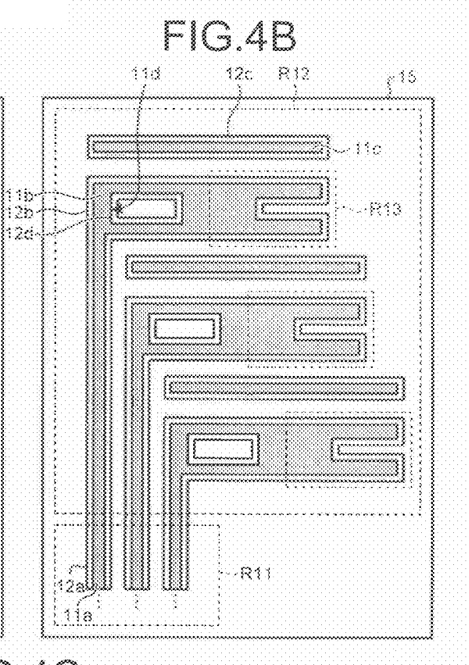

Next, as shown in FIG. 4B, for example, a sidewall material having a high selectivity with respect to the core patterns 11a and 11b and the core dummy patterns 11c is deposited on the whole surface of the process target film 15 including the sidewalls of the core patterns 11a and 11b and the core dummy patterns 11c, for example, by a method such as CVD.

Then, the process target film 15 is exposed in a state where the sidewall material is left on the sidewalls of the core patterns 11a and 11b and the core dummy patterns 11c by performing anisotropic etching on the sidewall material. At this time, sidewall patterns 12a and 12b are formed along the outer peripheries of the core patterns 11a and 11b, respectively, a sidewall dummy pattern 12c is formed along the outer periphery of the core dummy pattern 11c, and a sidewall dummy pattern 12d is formed along the inner periphery of the opening 11d of the core pattern 11b.

Figure 4C:
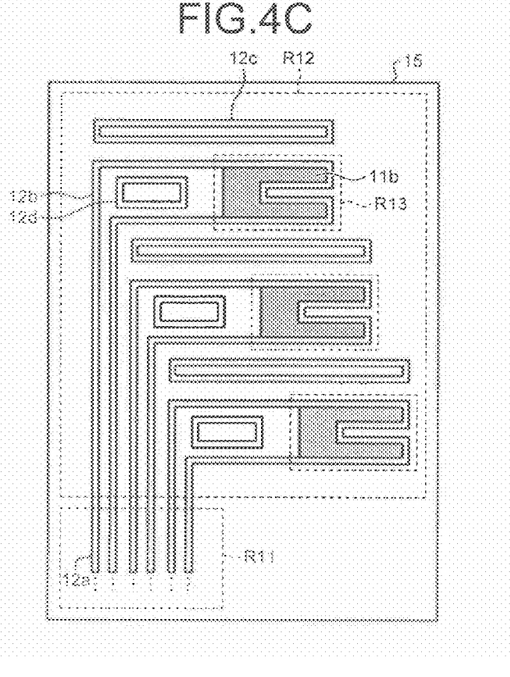

Next, as shown in FIG. 4C, the core patterns 11a and 11b and the core dummy patterns 11c are removed from over the process target film 15 in a state where the sidewall patterns 12a and 12b and the sidewall dummy patterns 12c and 12d are left on the process target film 15 by a method such as wet etching. At this time, in the pad portion R13, the core pattern 11b can be left by being covered with a resist pattern.

Next, as shown in FIG. 5A, the process target film 15 is processed with the sidewall patterns 12a and 12b, the sidewall dummy patterns 12c and 12d, and the core patterns 11b left in the pad portions R13 as a mask, so that the wires 15a, on which the sidewall patterns 12a are transferred, are formed in the wiring portion R11 and the leading lines 15b, on which the sidewall patterns 12b are transferred, are formed in the leading portion R12. At this time, in the pad portion R13, the pad electrode 15e connected to the tip ends of the leading lines 15b is formed in the process target film 15.

Moreover, in the leading portion R12, dummy leading lines 15c, on which the sidewall dummy patterns 12c are transferred, are formed in parallel with the leading lines 15b and dummy leading lines 15d, on which the sidewall dummy patterns 12d are transferred, are formed in parallel with the leading lines 15b.

The dummy leading lines 15c and 15d can be arranged such that the interval between the leading line 15b and the dummy leading lines 15c and 15d in the leading portion R12 becomes approximately equal to the interval between the wires 15a in the wiring portion R11. For example, when the line & space of the wires 15a in the wiring portion R11 is set to 1:1, the dummy leading lines 15c and 15d can be arranged such that the line & space around the leading lines 15b in the leading portion R12 becomes 1:1.

At this time, for example, when viewed along line E1-E1 in FIG. 5A, two dummy leading lines 15c or two dummy leading lines 15d are arranged parallel to the leading lines 15b between the leading lines 15b. Two adjacently-arranged dummy leading lines 15c to correspond to the sidewall dummy pattern 12c are formed along one side of the leading line 15b and two adjacently-arranged dummy leading lines 15d to correspond to the sidewall dummy pattern 12d are formed along the other side of the leading line 15b.

Consequently, even when the space of the leading portion R12 is wide compared with the wiring portion R11 and the pitch of the leading lines 15b of the leading portion R12 is larger than the wires 15a of the wiring portion R11, the micro-loading effect around the leading lines 15b of the leading portion R12 can be reduced, so that the line width of the leading lines 15b of the leading portion R12 can be made equal to the wires 15a of the wiring portion R11.

Figure 5B:
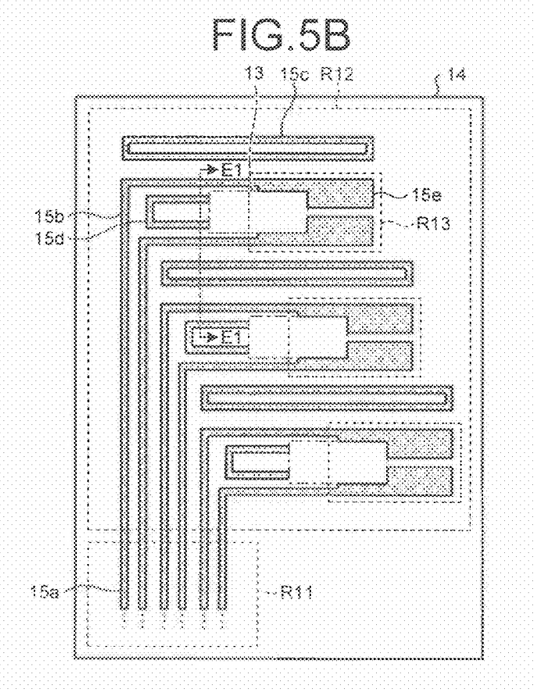

Next, as shown in FIG. 5B, a loop cut portion 13 is formed in the dummy leading line 15d and the pad electrode 15e to cut the pad electrode 15e for each of the wires 15a of the wiring portion R11 by using a photolithography technology and an etching technology.

In the above embodiment, the method of arranging two dummy leading lines 15c or two dummy leading lines 15d in parallel with the leading lines 15b between the leading lines 15b is explained, however, it is sufficient to arrange an even number of the dummy leading lines in parallel with the leading lines 15b between the leading lines 15b and, for example, four dummy leading lines may be arranged in parallel with the leading lines 15b between the leading lines 15b. Moreover, the number of the dummy leading lines arranged along one side of the leading line 15b and the number of the dummy leading lines arranged along the other side of the leading line 15b may be different from each other. Moreover, the resist pattern for forming the pad electrodes 15e may be formed after the process shown in FIG. 4C instead of after the process shown in FIG. 4B in the similar manner to the first embodiment and the sidewall patterns 12a and 12b, the sidewall dummy patterns 12c and 12d, and the resist pattern for forming the pad electrodes 15e may be transferred onto the process target film 15 via a hard mask layer.

Third Embodiment

FIG. 6A to FIG. 6C and FIG. 7A and FIG. 7B are plan views illustrating a manufacturing method of a semiconductor device according to the third embodiment.

Figure 6A:
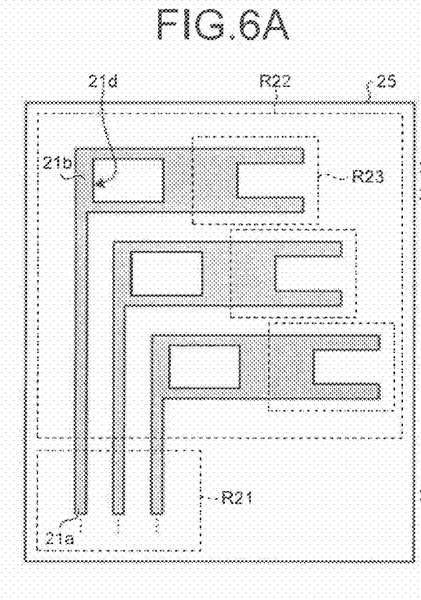
FIG. 6A to FIG. 6C are plan views illustrating a manufacturing method of a semiconductor device according to a third embodiment.
Figure 7A:
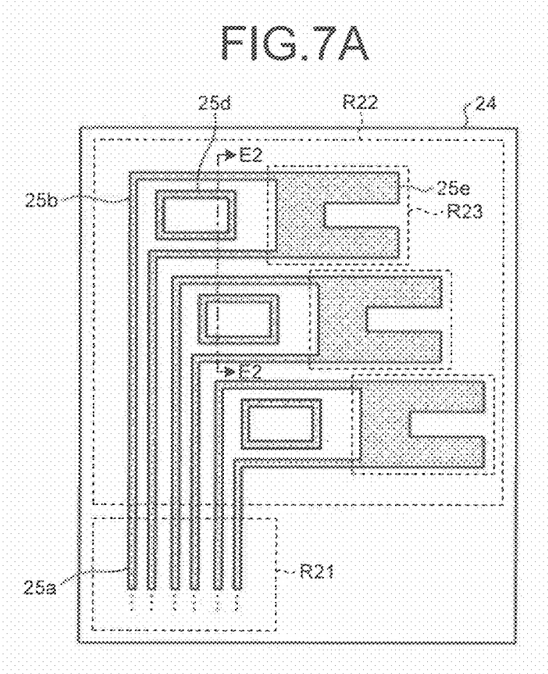
FIG. 7A and FIG. 7B are plan views illustrating the manufacturing method of the semiconductor device according to the third embodiment.

In FIG. 6A, a process target film 25 is formed on a base layer 24 shown in FIG. 7A. In the process target film 25, a wiring portion R21 and a leading portion R22 are provided, and pad portions R23 are provided in the leading portion R22. In the wiring portion R21, a plurality of wires 25a in FIG. 7A can be formed parallel to each other in a pattern similar to the wires 5a in the wiring portion R1 in FIG. 2A.

In the leading portion R22, leading lines 25b led out from the wires 25a of the wiring portion R21 can be formed perpendicular to the wires 25a. The pad portion R23 is provided at the tip end of this leading line 25b, and a pad electrode 25e connected to the leading lines 25b can be provided in the pad portion R23.

Then, core patterns 21a are formed in the wiring portion R21 and core patterns 21b are formed in the leading portion R22. The core pattern 21a is connected to the core pattern 21b and an opening 21d is provided in the core pattern 21b. The core pattern 21b is bent at a right angle in the leading portion R22.

Figure 6B:
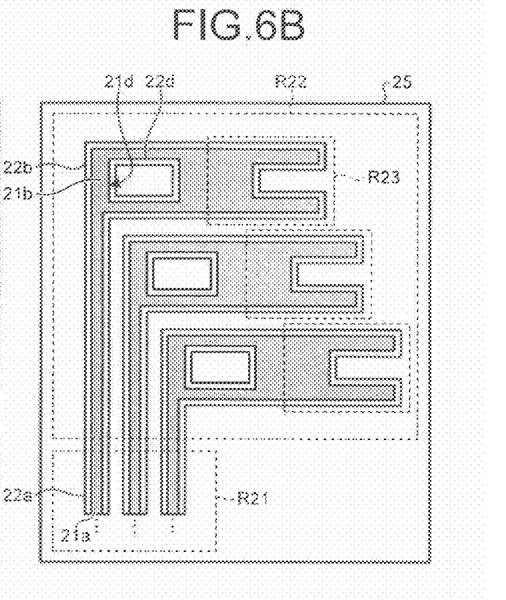

Next, as shown in FIG. 6B, for example, a sidewall material having a high selectivity with respect to the core patterns 21a and 21b is deposited on the whole surface of the process target film 25 including the sidewalls of the core patterns 21a and 21b, for example, by a method such as CVD. Then, the process target film 25 is exposed in a state where the sidewall material is left on the sidewalls of the core patterns 21a and 21b by performing anisotropic etching on the sidewall material. At this time, sidewall patterns 22a and 22b are formed along the outer peripheries of the core patterns 21a and 21b, respectively, and a sidewall dummy pattern 22d is formed along the inner periphery of the opening 21d of the core pattern 21b.

Figure 6C:
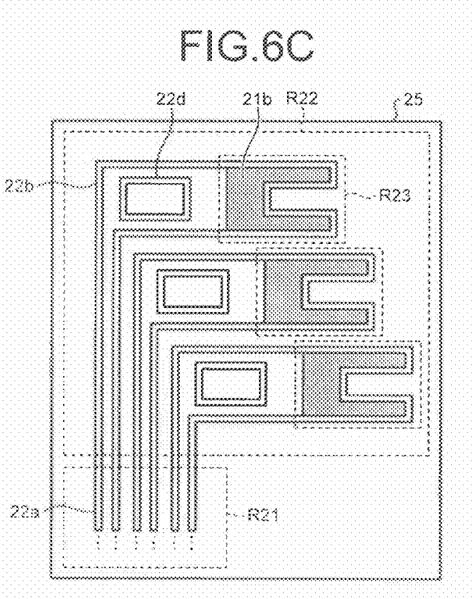

Next, as shown in FIG. 6C, the core patterns 21a and 21b are removed from over the process target film 25 in a state where the sidewall patterns 22a and 22b and the sidewall dummy patterns 22d are left on the process target film 25 by a method such as wet etching. At this time, in the pad portion R23, the core pattern 21b can be left by being covered with a resist pattern.

Next, as shown in FIG. 7A, the process target film 25 is processed with the sidewall patterns 22a and 22b, the sidewall dummy patterns 22d, and the core patterns 21b left in the pad portions R23 as a mask, so that the wires 25a, on which the sidewall patterns 22a are transferred, are formed in the wiring portion R21 and the leading lines 25b, on which the sidewall patterns 22b are transferred, are formed in the leading portion R22. At this time, in the pad portion R23, the pad electrode 25e connected to the tip ends of the leading lines 25b is formed in the process target film 25. Moreover, in the leading portion R22, dummy leading lines 25d, on which the sidewall dummy patterns 22d are transferred, are formed in parallel with the leading lines 25b.

The dummy leading lines 25d can be arranged such that the interval between the leading line 25b and the dummy leading line 25d in the leading portion R22 becomes approximately equal to the interval between the wires 25a in the wiring portion R21. For example, when the line & space of the wires 25a in the wiring portion R21 is set to 1:1, the dummy leading lines 25d can be arranged such that the line & space around the leading lines 25b in the leading portion R22 becomes 1:1.

At this time, for example, when viewed along line E2-E2 in FIG. 7A, two dummy leading lines 25d are adjacently arranged between the leading lines 25b in every two leading lines 25b. Two leading lines 25b and two dummy leading lines 25d are alternately arranged in the leading portion R22.

Consequently, even when the space of the leading portion R22 is wide compared with the wiring portion R21 and the pitch of the leading lines 25b of the leading portion R22 is larger than the wires 25a of the wiring portion R21, the micro-loading effect around the leading lines 25b of the leading portion R22 can be reduced, so that the line width of the leading lines 25b of the leading portion R22 can be made equal to the wires 25a of the wiring portion R21.

Figure 7B:
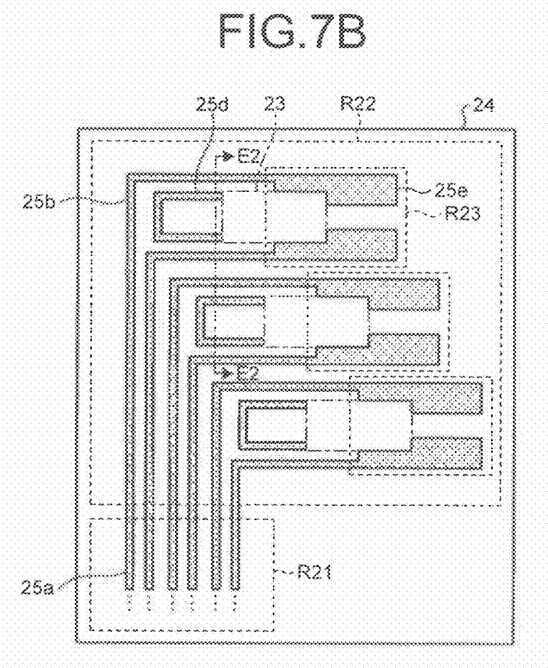

Next, as shown in FIG. 7B, a loop cut portion 23 is formed in the dummy leading line 25d and the pad electrode 25e to cut the pad electrode 25e for each of the wires 25a of the wiring portion R21 by using a photolithography technology and an etching technology.

In the above embodiment, the method of arranging two dummy leading lines 25d between the leading lines 25b in every two leading lines 25b is explained, however, it is sufficient to arrange an even number of the dummy leading lines between the leading lines 25b in every two leading lines 25b and, for example, four dummy leading lines may be arranged between the leading lines 25b in every two leading lines 25b. When arranging two dummy leading lines 25d between the leading lines 25b in every two leading lines 25b, it is sufficient to provided one opening 21d for each core pattern 21b, and when arranging four dummy leading lines between the leading lines in every two leading lines, it is sufficient to provide two openings for each core pattern. Moreover, the resist pattern for forming the pad electrodes 25e may be formed after the process shown in FIG. 6C instead of after the process shown in FIG. 6B in the similar manner to the first embodiment and the sidewall patterns 22a and 22b, the sidewall dummy patterns 22d, and the resist pattern for forming the pad electrodes 25e may be transferred onto the process target film 25 via a hard mask layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a plurality of wires formed in a wiring portion on a semiconductor substrate to be parallel to each other at substantially a constant pitch;
   a plurality of leading lines that are led out from the wires, respectively, and are formed in parallel with each other in a leading portion on the semiconductor substrate at a pitch larger than the wires;
   dummy leading lines that are formed in the leading portion on the semiconductor substrate and are arranged such that an even number thereof is arranged parallel to the leading lines between the leading lines; and
   a plurality of pad electrodes that are connected to each of the wires in the leading portion.

2. The semiconductor device according to claim 1, wherein, when a line & space of the wires of the wiring portion is set to 1:1, the dummy leading lines are arranged such that a line & space around the leading lines of the leading portion becomes 1:1.

3. The semiconductor device according to claim 1, wherein, as for the dummy leading lines, two dummy leading lines formed by cutting a loop and two dummy leading lines connected to each other in a loop shape are provided alternately.

4. The semiconductor device according to claim 1, wherein, as for the dummy leading lines, an even number of the dummy leading lines is arranged parallel to the leading lines between the leading lines in every two leading lines.

5. The semiconductor device according to claim 4, wherein the dummy leading lines comprise two dummy leading lines formed by cutting a loop.

6. The semiconductor device according to claim 1, further comprising pad electrodes that are provided for every leading lines in the leading portion and are connected to tip ends of the leading lines.

7. The semiconductor device according to claim 1, wherein the wires are word lines of a NAND memory.

* * * * *